United States Patent
Kubo (10) Patent No.: US 7,049,696 B2
(45) Date of Patent: May 23, 2006

(54) IC PACKAGE WITH ELECTRICALLY CONDUCTIVE HEAT-RADIATING MECHANISM, CONNECTION STRUCTURE AND ELECTRONIC DEVICE

(75) Inventor: Naoki Kubo, Saitama-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/631,804

(22) Filed: Aug. 1, 2003

(65) Prior Publication Data

US 2004/0021220 A1 Feb. 5, 2004

(30) Foreign Application Priority Data

Aug. 2, 2002 (JP) .............................. 2002-225669

(51) Int. Cl.
- *H01L 23/34* (2006.01)
- *H01L 23/48* (2006.01)
- *H05K 7/02* (2006.01)
- *H05K 7/06* (2006.01)
- *H05K 7/08* (2006.01)

(52) U.S. Cl. ...................... 257/706; 257/717; 257/712; 257/713; 257/720; 257/675; 257/684; 257/796; 257/696; 257/691; 257/698; 257/690; 257/784; 257/786; 257/701; 361/783; 361/720; 361/71; 361/719; 174/252

(58) Field of Classification Search ................ 257/675, 257/706, 712, 713, 717, 720, 710, 684, 796, 257/666, 696, 674, 784, 786, 690–693, 698, 257/700, 701, 758; 361/719–721, 783; 174/52.1, 174/252

See application file for complete search history.

(56) References Cited

U.S. PATENT DOCUMENTS

| | | | |
|---|---|---|---|
| 5,307,237 A * | 4/1994 | Walz | 361/718 |
| 5,506,755 A * | 4/1996 | Miyagi et al. | 361/720 |
| 5,952,709 A * | 9/1999 | Kitazawa et al. | 257/664 |
| 6,028,354 A * | 2/2000 | Hoffman | 257/706 |
| 6,046,495 A | 4/2000 | Urushima | |
| 6,208,023 B1 * | 3/2001 | Nakayama et al. | 257/696 |
| 6,282,094 B1 * | 8/2001 | Lo et al. | 361/704 |
| 6,359,341 B1 * | 3/2002 | Huang et al. | 257/778 |
| 6,521,990 B1 * | 2/2003 | Roh et al. | 257/706 |
| 6,538,313 B1 * | 3/2003 | Smith | 257/684 |
| 6,545,347 B1 * | 4/2003 | McClellan | 257/690 |
| 6,583,499 B1 * | 6/2003 | Huang et al. | 257/666 |
| 6,586,677 B1 * | 7/2003 | Glenn | 174/52.2 |
| 6,635,209 B1 * | 10/2003 | Huang | 264/154 |
| 6,646,339 B1 * | 11/2003 | Ku et al. | 257/708 |
| 6,657,296 B1 * | 12/2003 | Ho et al. | 257/720 |
| 6,657,311 B1 * | 12/2003 | Hortaleza et al. | 257/778 |
| 6,744,135 B1 * | 6/2004 | Hasebe et al. | 257/712 |
| 2002/0034066 A1 * | 3/2002 | Huang et al. | 361/704 |
| 2002/0162678 A1 * | 11/2002 | Takano | 174/52.1 |
| 2003/0006492 A1 * | 1/2003 | Ogasawara et al. | 257/684 |

(Continued)

FOREIGN PATENT DOCUMENTS

JP 7-249724 A 9/1995

(Continued)

*Primary Examiner*—Alexander Oscar Williams
(74) *Attorney, Agent, or Firm*—Sughrue Mion, PLLC (57) ABSTRACT

A connection structure including an IC chip, a substrate disposed with a conductive layer, and a heat-radiating mechanism that is mounted on the substrate, disposed between the IC chip and the substrate, and dissipates heat of the IC chip, wherein terminals of the IC chip are electrically connected to the conductive layer via the heat-radiating mechanism.

9 Claims, 7 Drawing Sheets

U.S. PATENT DOCUMENTS

2003/0024633 A1* 2/2003 Ogura et al. ................ 156/250
2003/0164549 A1* 9/2003 Nakayama .................. 257/777
2004/0075166 A1* 4/2004 Yang et al. ................. 257/706
2004/0125578 A1* 7/2004 Konishi et al. ............. 361/783
2004/0253767 A1* 12/2004 Nurminen ................... 438/125

FOREIGN PATENT DOCUMENTS

JP  10-56097  *  2/1998
TW  454277 A  *  9/2001

* cited by examiner

IC PACKAGE WITH ELECTRICALLY CONDUCTIVE HEAT-RADIATING MECHANISM, CONNECTION STRUCTURE AND ELECTRONIC DEVICE

CROSS-REFERENCE TO RELATED APPLICATION

This application claims priority under 35 USC 119 from Japanese Patent Application No. 2002-225669, the disclosure of which is incorporated by reference herein.

BACKGROUND OF THE INVENTION

1. Field of the Invention

The present invention relates to technology for electrically connecting terminals of an IC chip to a conductive layer disposed in a substrate.

2. Description of the Related Art

With respect to IC (integrated circuit) chips, bus sizes are being expanded and analog functions are being disposed in accompaniment with an increase in high speed processing in recent years. Thus, the number of terminals such as ground terminals or power terminals is increasing, and costs and package sizes are becoming large. For this reason, as shown in FIG. 7, as a connection structure for connecting, to a circuit substrate, a package in which an IC chip is sealed, there is a connection structure that uses a lead frame (conductive portion) 82 of a lead 81 derived from a package 80 as a ground layer (see Japanese Patent Application Laid-Open Publication (JP-A) No. 7-249724).

Figure 7:
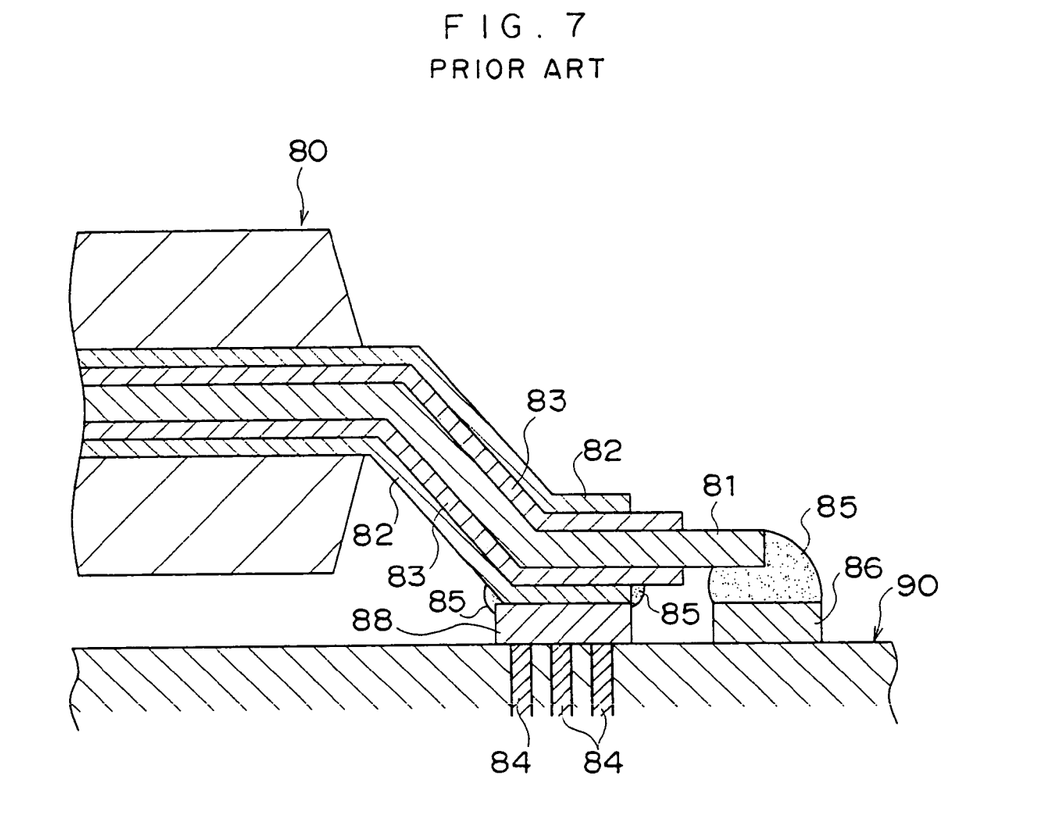
FIG. 7 is a cross-sectional view showing the schematic configuration of a connection structure pertaining to a conventional example.

That is, in the connection structure shown in FIG. 7, the lead 81 is connected by solder 85 to a signal-use land (pad) 86 disposed on a circuit substrate 90, and the lead frame 82 is connected by the solder 85 to a ground-use pad 88 disposed on the circuit substrate 90. Also, in the connection structure shown in FIG. 7, a dielectric member 83, which is formed by an insulating film that prevents electromagnetic interference between adjacent leads, is disposed between the lead 81 and the lead frame 82. Moreover, plural thermal vias (through-holes filled with a metal) 84 are formed below the ground-use pad 88 in the circuit substrate 90.

Because the lead frame 82 is used as a ground layer in the connection structure shown in FIG. 7, a ground connecting lead becomes unnecessary and, as a result, the number of lead pins can be reduced. Also, because the ground-use pad 88 is connected to the thermal vias 84 in the connection structure shown in FIG. 7, the heat-radiating effect is improved.

However, in the connection structure described in JP-A No. 7-249724, it is necessary to superpose the lead 81, the dielectric member (insulating film) 83 and the lead frame 82 in order to use the lead frame 82 as a ground layer. Therefore, in the conventional example shown in FIG. 7, because the terminal structure around the lead 81 becomes complex and minute, costs increase and packaging labor becomes difficult.

SUMMARY OF THE INVENTION

In consideration of the above-described facts, it is an object of the invention to provide an IC package, a connection structure and an electronic device that are made simple and inexpensive by reducing terminals.

A first aspect of the present invention provides an IC package which comprises: an IC chip; a substrate including a conductive layer; and a heat-radiating mechanism that is mounted on the substrate, disposed between the IC chip and the substrate, and dissipates heat of the IC chip, wherein terminals of the IC chip and the heat-radiating mechanism are electrically connected, and the heat-radiating mechanism and the conductive layer of the substrate are electrically connected.

Heat generated by the IC chip is transmitted to the heat-radiating mechanism and is radiated (dispersed). Because the terminals of the IC chip and the conductive layer of the substrate can be electrically connected via the heat-radiating mechanism, the heat-radiating mechanism can be used as a connection terminal. For this reason, by using the heat-radiating mechanism as a connection terminal of at least one of power terminals and ground terminals, with respect to which many are necessary, at least one of power terminals and ground terminals (e.g., in the conventional example shown in FIG. 7, corresponding to the lead frame and the ground-use pad) can be reduced. In this case, the terminals of the IC chip are ground terminals or power terminals, and the conductive layer of the substrate is a ground layer or a power layer.

A second aspect of the invention provides a connection structure which comprises: an IC chip; a substrate disposed with a conductive layer; and a heat-radiating mechanism that is mounted on the substrate, disposed between the IC chip and the substrate, and dissipates heat of the IC chip, wherein terminals of the IC chip are electrically connected to the conductive layer via the heat-radiating mechanism.

Because corresponding terminals (e.g., power terminals or ground terminals) can be reduced by using the heat-radiating mechanism as a connection terminal, the connection structure becomes simpler and packaging labor becomes easier and less inexpensive than has conventionally been the case. Note that the terminals of the IC chip may be connected to the heat-radiating mechanism by wire bonding or a flip chip.

Additionally, in the invention, the dissipating mechanism may be plurally disposed and these dissipating mechanisms may be used as power terminals or ground terminals.

A third aspect of the invention provides a connection method which is a method of connecting an IC chip and a substrate including a conductive layer sandwiched between insulating layers, the method comprising the steps of: (a) disposing a heat-radiating mechanism between the IC chip and the substrate; (b) fixing the IC chip to the heat-radiating mechanism; (c) disposing plural through-holes in at least one of the insulating layers; and (d) disposing connection members in the through-holes so that the heat-radiating mechanism and the conductive layer of the substrate are electrically connected via the connection members.

A fourth aspect of the invention provides an electrical device which is disposed with an IC package that includes: an IC chip; a substrate including a conductive layer; and a heat-radiating mechanism that is mounted on the substrate, disposed between the IC chip and the substrate, and dissipates heat of the IC chip, wherein terminals of the IC chip and the heat-radiating mechanism are electrically connected, and the heat-radiating mechanism and the conductive layer of the substrate are electrically connected.

A fifth aspect of the invention provides an electrical device which is disposed with a connection structure that includes: an IC chip; a substrate disposed with a conductive layer; and a heat-radiating mechanism that is mounted on the substrate, disposed between the IC chip and the substrate, and dissipates heat of the IC chip, wherein terminals of the IC chip are electrically connected to the conductive layer via the heat-radiating mechanism.

Note that the electrical devices pertaining to the fourth and fifth aspects are of a concept that includes digital still cameras, digital video cameras, mobile telephones, personal computers, and Personal Digital Assistants (PDAs).

DETAILED DESCRIPTION OF THE INVENTION

First Embodiment

Figure 1:
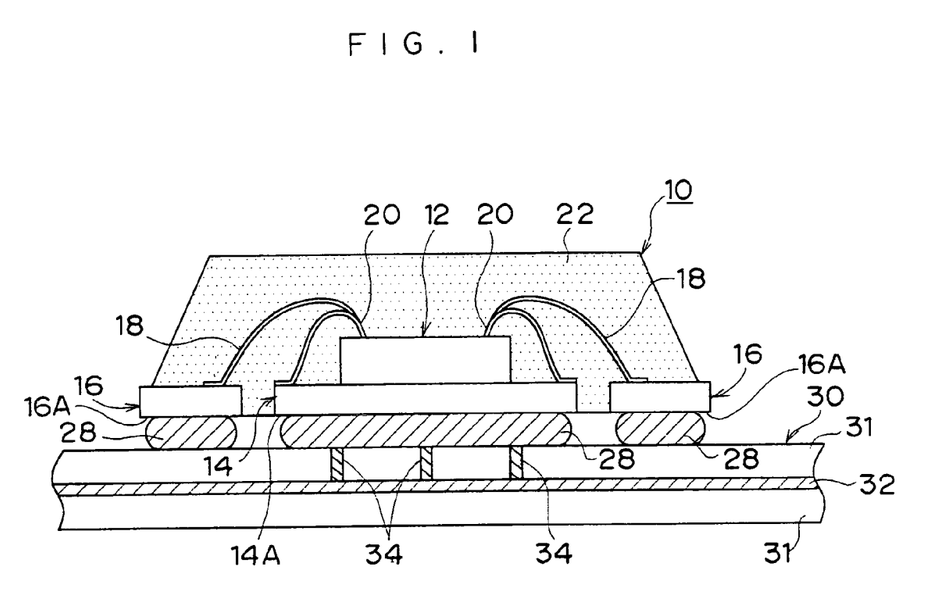
FIG. 1 is a cross-sectional view showing the schematic configuration of a connection structure relating to an IC package of a first embodiment of the invention.
Figure 2:
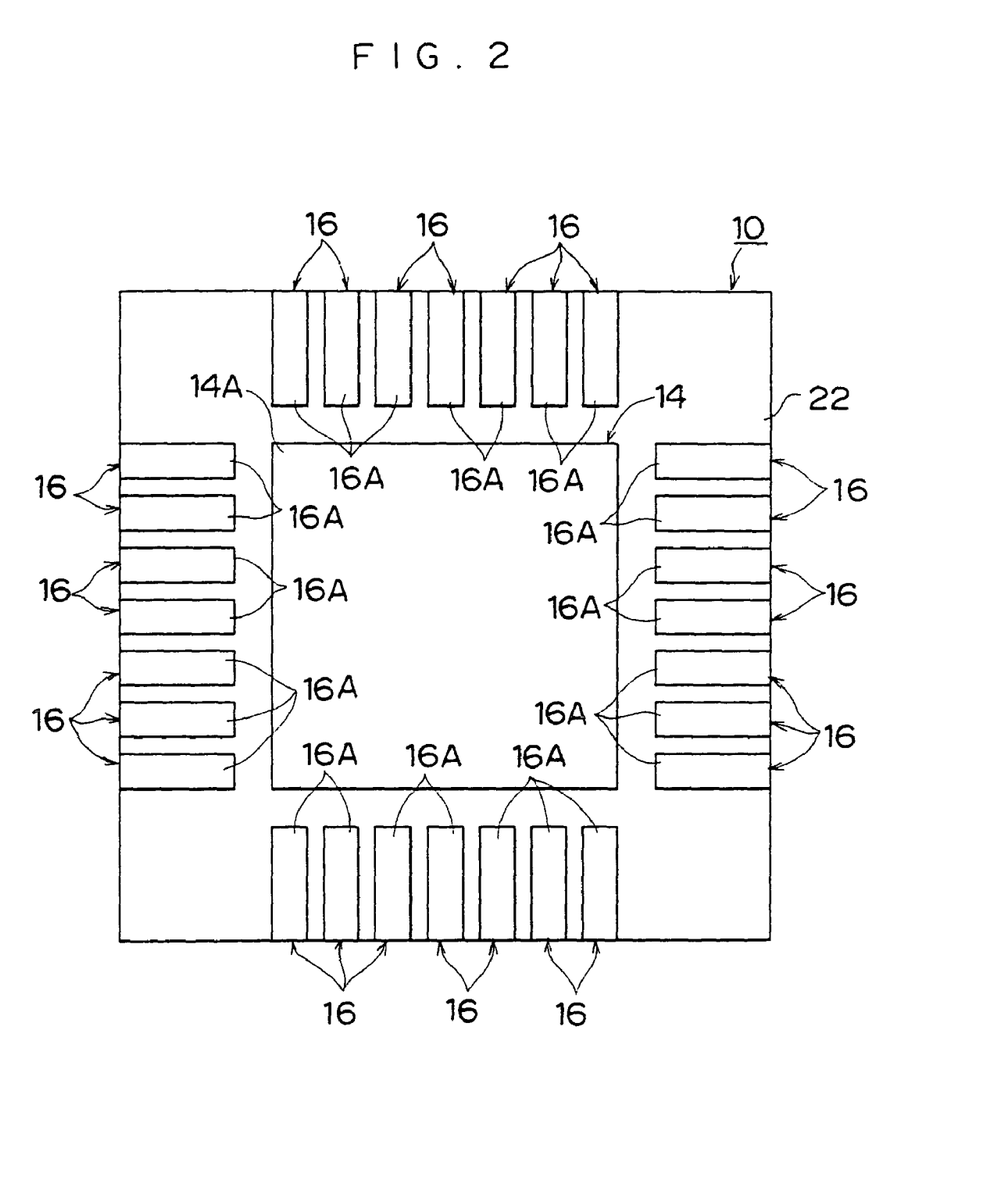
FIG. 2 is a bottom view of the IC package shown in FIG. 1.

An IC package and a connection structure pertaining to a first embodiment of the invention will be described below on the basis of FIGS. 1 and 2. FIG. 1 is a cross-sectional diagram showing the schematic configuration of the connection structure relating to the IC package of the present embodiment, and FIG. 2 is a bottom view of the IC package shown in FIG. 1.

As shown in FIG. 1, an IC package 10 pertaining to the present embodiment is disposed with a rectangular parallelopiped IC chip 12, a heat sink 14 that is a heat-radiating mechanism, plural terminals (leads) 16, and signal-use bonding wires 18 and ground-use bonding wires 20 connected to unillustrated pads (terminals) of the IC chip 12, and is sealed integrally by a mold resin 22. The ground-use bonding wires 20 configure part of the terminals of the IC chip 12.

The signal-use bonding wires 18 are connected by wire bonding to unillustrated pads of the terminals 16, and the ground-use bonding wires 20 are connected by wire bonding to unillustrated pads of the heat sink 14. The IC chip 12 is fixed, via a heat-conductive adhesive or the like, to an upper surface of the heat sink 14.

The thin-board-shaped heat sink 14 is formed by a metal that has high heat conductivity and is conductive, such as a material like aluminium, and is disposed in the center of the IC package 10. Also, as shown in FIG. 2, a bottom surface 14A of the heat sink 14 and bottom surfaces 16A of the terminals 16 are respectively exposed. Moreover, the plural terminals 16 are disposed at predetermined intervals along the four edges of the IC package 10 so that they enclose the IC chip 12.

Next, the connection structure pertaining to the present embodiment will be described with reference to FIG. 1. A tabular circuit substrate 30 is disposed with insulating layers 31, which are molded with a non-metallic ceramic or the like, and a ground layer 32, which is a conductive layer disposed between the insulating layers 31. The ground layer 32 is formed by a conductive metal. Also, unillustrated lands for respectively connecting the terminals 16 and the heat sink 14 are formed at plural places on the circuit substrate 30.

Plural connection portions 34, which are connection mechanisms connected to the ground layer 32, are disposed at the lands (not shown) corresponding to the heat sink 14 so that they are exposed at surfaces of the lands (circuit substrate 30). These connection portions 34 are formed by disposing a conductive metal in through-holes disposed in the land-side insulating layer 31. When the IC package 10 is mounted to the circuit substrate 30 by solder 28, the terminals 16, the heat sink 14 and the corresponding respective lands are connected via the solder 28.

That is, one end of each connection portion 34 is connected to the ground layer 32 and the other end of each connection portion 34 is connected to the heat sink 14 via the solder 28. For this reason, the connection structure pertaining to the present embodiment forms a ground path in which unillustrated plural ground terminals (pads) of the IC chip 12 are electrically connected to the ground layer 32 via the ground-use bonding wires 20, the heat sink 14, the solder 28 and the connection portions 34.

In the present embodiment, heat generated by the IC chip 12 is transmitted to the heat sink 14 and radiated or dispersed. Also, in the present embodiment, because the heat sink 14 is connected to the ground layer 32 via the solder 28 and the connection portions 34, the heat-radiating effect is improved and package strength is also improved.

Moreover, in the present embodiment, because the ground terminals (unillustrated pads) of the IC chip 12 and the ground layer 32 of the circuit substrate 30 can be electrically connected via the heat sink 14, the heat sink 14 is also used as a connection terminal. For this reason, according to the present embodiment, by using the heat sink 14 as a connection terminal of the ground terminals, with respect to which many are necessary, ground terminals (in the conventional example shown in FIG. 7, the lead frame 82 and the ground-use pad 88) can be reduced.

Therefore, according to the present embodiment, corresponding terminals (specifically, ground terminals) can be reduced by using the heat sink 14 as a connection terminal, whereby the connection structure becomes simpler and packaging labor becomes easier and less inexpensive than has conventionally been the case.

Second Embodiment

Figure 3:
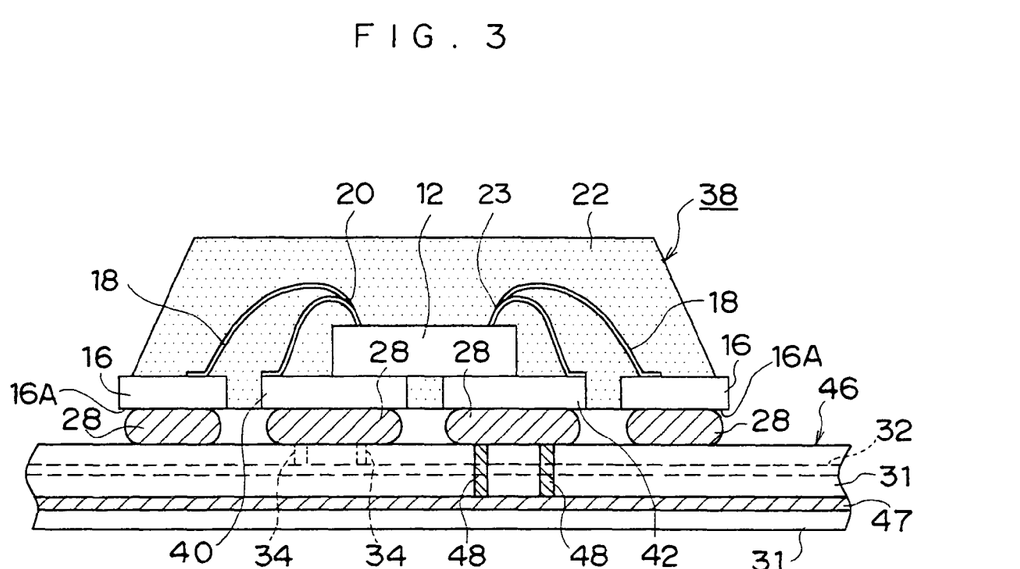
FIG. 3 is a cross-sectional view showing the schematic configuration of a connection structure relating to an IC package of a second embodiment of the invention.
Figure 4:
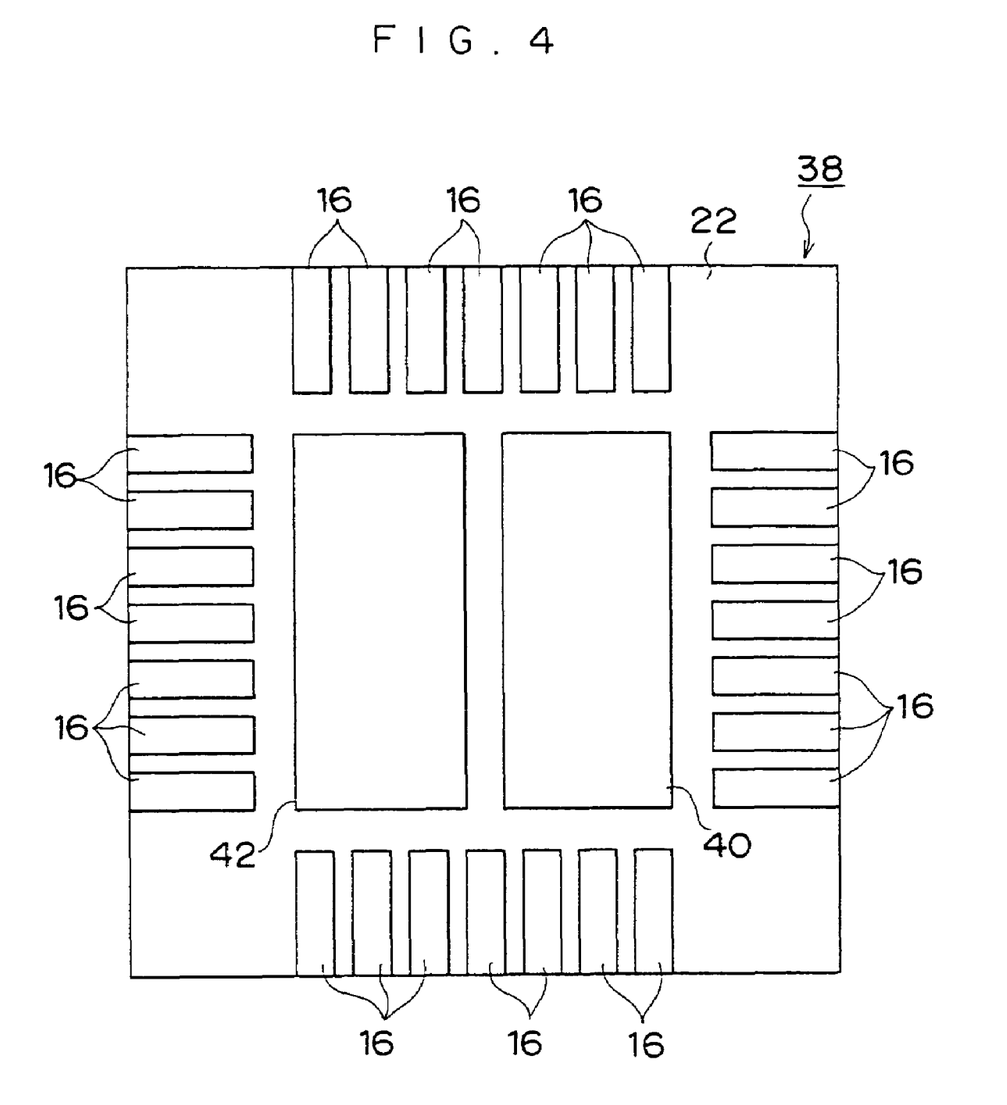
FIG. 4 is a bottom view of the IC package shown in FIG. 3.

A second embodiment of the invention will be described below with reference to FIGS. 3 and 4. The present embodiment is an example where plural heat-radiating mechanisms are disposed and these heat-radiating mechanisms respectively serve as a power terminal or a ground terminal. FIG. 3 is a cross-sectional diagram showing a connection structure relating to an IC package of the present embodiment, and FIG. 4 is a bottom view of the IC package shown in FIG. 3. In FIGS. 3 and 4, the same reference numerals will be given to portions corresponding to those of FIGS. 1 and 2, and detailed description of those portions will be omitted.

As shown in FIGS. 3 and 4, in an IC package 38, heat sinks 40 and 42 serving as heat-radiating mechanisms are respectively disposed so that at least part of each of the heat sinks 40 and 42 is disposed below the IC chip 12 (e.g., in the present embodiment, the heat sinks 40 and 42 are disposed so that each is positioned halfway below the IC chip 12 when seen in the cross-sectional view of FIG. 3). The heat sinks 40 and 42 are fixed in a separated state so that they are not energized by the two being connected. As shown in FIG. 3, the ground-use bonding wires 20 are connected by wire bonding to the heat sink 40, and power-use bonding wires 23 are connected by wire bonding to the heat sink 42.

A circuit substrate 46 is disposed with the ground layer 32 represented by dotted lines and a power layer 47, which is a conductive layer disposed between the insulating layers 31. The power layer 47 is formed by a conductive metal. Also, plural connection portions 48, which serve as connection mechanisms connected to the power layer 47, are disposed at lands (not shown) corresponding to the heat sink 42 so that they are exposed at surfaces of the lands (circuit substrate 46). These connection portions 48 are formed by disposing a conductive metal in through-holes disposed in the land-side insulating layer 31.

When the IC package 10 is mounted to the circuit substrate 46 via the solder 28, one end of each connection portion 48 is connected to the power layer 47 via the solder 28. For this reason, the connection structure pertaining to the present embodiment forms a power path in which unillustrated plural power terminals (pads) of the IC chip 12 are electrically connected to the power layer 47 via the power-use bonding wires 23, the heat sinks 40 and 42, the solder 28 and the connection portions 48. Because other configurations are the same as those in the first embodiment, description thereof will be omitted.

In the present embodiment, the heat sink 40 is used as a connection terminal of the ground terminals, with respect to which many are necessary, and the heat sink 42 is used as a connection terminal of the power terminals, with respect to which many are necessary. That is, according to the present embodiment, because the heat sinks 40 and 42 are used as respective connection terminals of the power terminals and the ground terminals, with respect to which many are necessary, the power terminals and the ground terminals can be respectively reduced.

Therefore, according to the present embodiment, because terminals (specifically, power terminals and ground terminals) can be substantially reduced even more than in the case of the first embodiment, the connection structure becomes even simpler and packaging labor becomes even easier and less inexpensive. It should be noted that, because other actions and effects are the same as those of the first embodiment, description thereof will be omitted.

Figure 5:
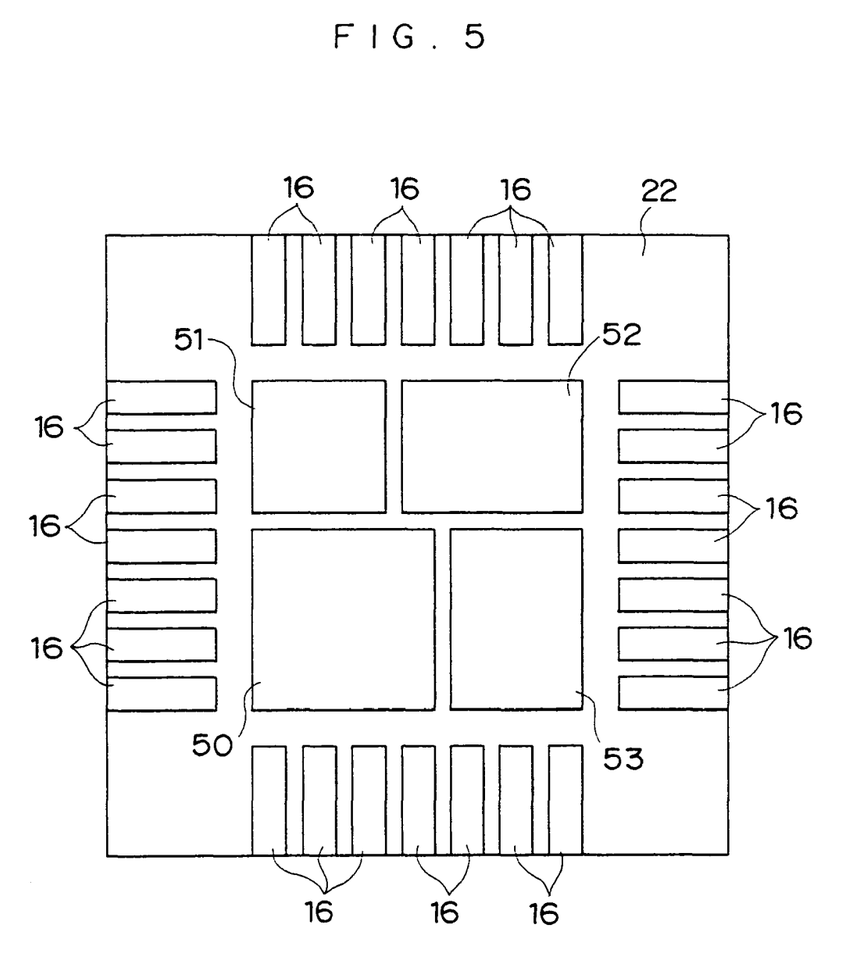
FIG. 5 is a bottom view of a modified example of the IC package shown in FIG. 3.

The example shown in FIG. 5 is a modified example of the second embodiment shown in FIGS. 3 and 4. In this modified example, the number of heat sinks is increased to four. FIG. 5 is a bottom view of an IC package pertaining to the present example. In FIG. 5, the same reference numerals will be given to portions corresponding to those of FIG. 4, and detailed description of those portions will be omitted.

In the present example, a heat sink 50 is used as a connection terminal of the ground terminals, heat sinks 51 and 52 are used as connection terminals of power terminals whose voltages are respectively different, and a heat sink 53 is used as a connection terminal of drive terminals. The heat sink 53 is used, for example, for output of a large current used in the current control of a backlight.

The corresponding bonding wires connected to the IC chip 12 shown in FIG. 3 are respectively connected to each of the heat sinks 50 to 53. Moreover, connection portions and a conductive layer corresponding to each of the heat sinks 50 to 53 are respectively disposed at an unillustrated circuit substrate.

According to the present example, because terminals (specifically, two kinds of power terminals, drive terminals, and ground terminals) can be substantially reduced even more than in the case of the second embodiment, the connection structure becomes even simpler and packaging labor becomes even easier and less inexpensive. It should be noted that, because other configurations, actions and effects are the same as those of the second embodiment shown in FIGS. 3 and 4, description thereof will be omitted.

Third Embodiment

Figure 6:
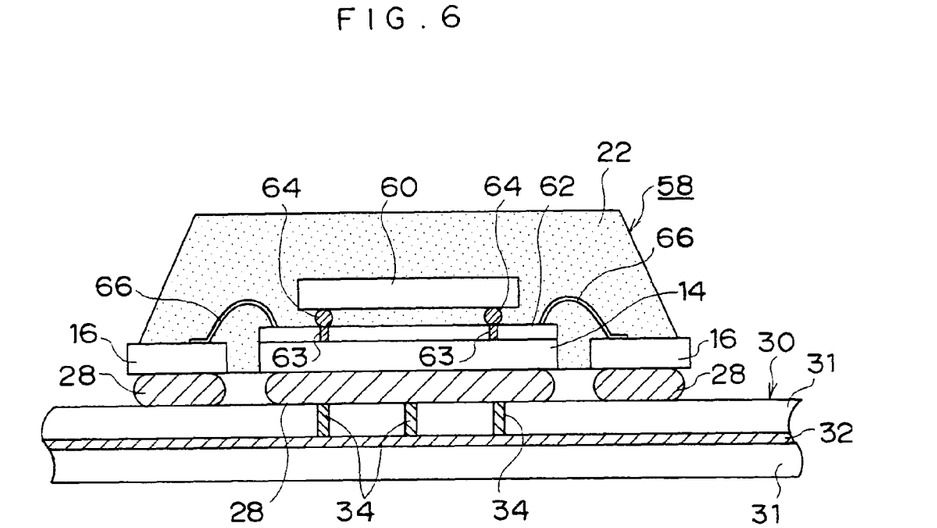
FIG. 6 is a cross-sectional view showing the schematic configuration of a connection structure relating to an IC package of a third embodiment of the invention.

A third embodiment of the invention will be described below with reference to FIG. 6. The present embodiment is an example where an IC chip is mounted in a flip chip format (connection) with respect to a wiring substrate disposed on a heat sink. FIG. 6 is a cross-sectional diagram showing a connection structure relating to an IC package 58 of the present embodiment. In FIG. 6, the same reference numerals will be given to portions corresponding to those of FIG. 1, and detailed description of those portions will be omitted.

A wiring substrate 62 is formed by laminate or the like, an unillustrated conductive pattern is formed on a surface thereof, and plural lands (not shown) are formed at appropriate sites on the conductive pattern. An IC chip 60 is connected to solder bumps 64 of a conductive material formed in advance on the lands of the wiring substrate 62.

Connection portions 63, which form part of a ground path electrically connected to the ground layer 32 of the circuit substrate 30, are disposed in the wiring substrate 62. The connection portions 63 are formed by a conductive metal and are respectively connected to the solder bumps 64 and the heat sink 14. It should be noted that signal-use bonding wires 66 are connected by wire bonding to unillustrated lands at the wiring substrate 62. Because other configurations, actions and effects are the same as those of the first embodiment, description thereof will be omitted.

It should be noted that the connection structures pertaining to the above-described embodiments can be combined and optionally changed. For example, the heat sink 14 shown in FIG. 6 may be plurally disposed as shown in FIG. 3 or FIG. 5. Also, the connection method of the IC chip and the like can be optionally changed to, for example, a Tape Automated Board (TAB) or a Ball Grid Array (BGA).

Also, the connection structure pertaining to each of the above-described embodiments, such as the shape and number of the connection portions, can be optionally changed. Moreover, an electrical device to which the IC package or connection structure pertaining to the above-described embodiments is applied (mounted) is of a concept that includes digital still cameras, digital video cameras, mobile telephones, personal computers, and Personal Digital Assistants (PDAs).

As described above, in the invention, because the terminals of the IC chip and the conductive layer of the substrate can be electrically connected via the heat-radiating mechanism, the heat-radiating mechanism is used as a connection terminal. That is, according to the invention, because corresponding terminals (e.g., power terminals or ground terminals) can be reduced by using the heat-radiating mechanism as a connection terminal, the connection structure becomes simpler and packaging labor becomes easier and less expensive than has conventionally been the case.

What is claimed is:

1. An IC package comprising:
   an IC chip;
   a substrate including a conductive layer; and
   a heat-radiating mechanism that is mounted on the substrate, disposed between the IC chip and the substrate, and dissipates heat of the IC chip, wherein the heat-radiating mechanism comprises plural laterally adjacent heat sinks, and at least part of each heat sink is disposed directly below the IC chip, wherein terminals of the IC chip and the heat-radiating mechanism are electrically connected, and the heat-radiating mechanism and the conductive layer of the substrate are electrically connected, wherein said conductive layer is a ground layer, and said substrate includes another conductive layer, said another conductive layer being a power layer, and wherein a first of said plural heat sinks are electrically connected to the ground layer and a second of said plural heat sinks are electrically connected to the power layer.

2. The IC package of claim 1, wherein the plural heat sinks are disposed so as to be separate from each other.

3. The IC package of claim 1, wherein the IC chip is fixed on the heat-radiating mechanism.

4. The IC package of claim 1, wherein the IC chip and the heat-radiating mechanism are electrically connected by wire bonding.

5. The IC package of claim 1, wherein the IC chip and the heat-radiating mechanism are electrically connected by a conductive material.

6. The IC package of claim 1, further including an insulating layer between the heat-radiating mechanism and the conductive layer of the substrate, wherein the heat-radiating mechanism and the conductive layer of the substrate are electrically connected via connection members disposed in plural through-holes disposed in the insulating layer.

7. The IC package of claim 1, wherein at least a first of the terminals of the IC chip being a ground terminal electrically connected to said first of said plural heat sinks; and at least a second of the terminals of the IC chip being a power terminal electrically connected to said second of said plural heat sinks.

8. The IC package of claim 2, further including an insulating layer between the heat-radiating mechanism and the conductive layers of the substrate, wherein said first of said plural heat sinks and the ground layer are electrically connected via a first set of connection members disposed in plural through holes disposed in insulating layer, and wherein said second of said plural heat sinks and the power layer are electrically connected via a second set of connection members disposed in plural through holes disposed in insulating layer.

9. An electrical device disposed with an IC package that includes:

an IC chip;

a substrate including a conductive layer; and a heat-radiating mechanism that is mounted on the substrate, disposed between the IC chip and the substrate, and dissipates heat of the IC chip, wherein the heat-radiating mechanism comprises plural laterally adjacent heat sinks, and at least part of each heat sink is disposed directly below the IC chip, wherein terminals of the IC chip and the heat-radiating mechanism are electrically connected, and the heat-radiating mechanism and the conductive layer of the substrate are electrically connected, wherein said conductive layer is a ground layer, and said substrate includes another conductive layer, said another conductive layer being a power layer, and wherein a first of said plural heat sinks are electrically connected to the ground layer and a second of said plural heat sinks are electrically connected to the power layer.

* * * * *